US012412797B2

(12) United States Patent
Woetzel et al.

(10) Patent No.: US 12,412,797 B2
(45) Date of Patent: Sep. 9, 2025

(54) HYBRID EMBEDDED PACKAGE

(71) Applicant: Infineon Technologies AG, Neubiberg (DE)

(72) Inventors: Stefan Woetzel, Erfurt (DE); Chee Yang Ng, Muar (MY)

(73) Assignee: Infineon Technologies AG, Neubiberg (DE)

( * ) Notice: Subject to any disclaimer, the term of this patent is extended or adjusted under 35 U.S.C. 154(b) by 359 days.

(21) Appl. No.: 17/973,920

(22) Filed: Oct. 26, 2022

(65) Prior Publication Data
US 2023/0052437 A1   Feb. 16, 2023

Related U.S. Application Data

(63) Continuation of application No. 17/070,559, filed on Oct. 14, 2020, now Pat. No. 11,521,907.

(51) Int. Cl.
*H01L 23/31* (2006.01)
*H01L 23/538* (2006.01)

(52) U.S. Cl.
CPC ...... *H01L 23/3121* (2013.01); *H01L 23/3157* (2013.01); *H01L 23/5389* (2013.01)

(58) Field of Classification Search
CPC ........... H01L 23/49575; H01L 23/3121; H01L 23/3157; H01L 23/5389; H01L 23/3107; H01L 24/94
See application file for complete search history.

(56) References Cited

U.S. PATENT DOCUMENTS

| 8,299,588 B1* | 10/2012 | Tateishi | ............ H01L 23/49575 |
| | | | 257/676 |
| 9,735,131 B2 | 8/2017 | Su et al. | |
| 2015/0162319 A1 | 6/2015 | Scharf et al. | |
| 2017/0084555 A1 | 3/2017 | Yu et al. | |
| 2017/0207197 A1 | 7/2017 | Yu et al. | |
| 2017/0229435 A1 | 8/2017 | Noquil et al. | |
| 2020/0381345 A1 | 12/2020 | Chang et al. | |
| 2021/0050297 A1 | 2/2021 | Kim et al. | |
| 2021/0082889 A1 | 3/2021 | Noquil et al. | |
| 2021/0305164 A1 | 9/2021 | Tseng et al. | |
| 2022/0359333 A1* | 11/2022 | Yu | ...................... H01L 23/5389 |

FOREIGN PATENT DOCUMENTS

WO   2019132964 A1   7/2019

* cited by examiner

*Primary Examiner* — Zandra V Smith
*Assistant Examiner* — John M Parker
(74) *Attorney, Agent, or Firm* — Murphy, Bilak & Homiller, PLLC (57) ABSTRACT

A method of producing a semiconductor package includes providing a substrate formed of electrically insulating material and including a die mounting surface, and a first semiconductor die embedded within the substrate, the first semiconductor die including a first conductive terminal that faces the die mounting surface, providing a second semiconductor die that includes a first conductive terminal, and mounting the second semiconductor die on the die mounting surface such that the first conductive terminal of the second semiconductor die faces and is spaced apart from the die mounting surface, a first electrical connection that directly connects the first conductive terminals of the first and second semiconductor dies together is formed, and the second semiconductor die partially overlaps with the first semiconductor die.

8 Claims, 6 Drawing Sheets

HYBRID EMBEDDED PACKAGE

BACKGROUND

Semiconductor dies are commonly assembled in a semiconductor package. Semiconductor packages provide a connective interface between the terminals of a semiconductor die and an external apparatus, such as a printed circuit board (PCB). Additionally, semiconductor packages seal and protect the semiconductor die and associated electrical connections from potentially damaging environmental conditions, such as temperature variations, moisture, dust particles, etc. A wide variety of different semiconductor package types have evolved to meet different application needs. Examples of these semiconductor package types include through-hole style packages such as DIP (dual in-line package) packages, TO (transistor outline) packages, leadless packages such as QFN (quad flat no-leads) packages, surface mount type packages such as BGA (ball grid array) packages, etc.

Applications that require switching of large currents at high frequencies place specific requirements on the design of semiconductor packages. In these applications, the parasitic effects of the electrical interconnections within the package can play a significant role in the performance of the device. Thus, there is a need to improve current semiconductor package designs to reduce the parasitic effects of the electrical interconnections within the package.

SUMMARY

A semiconductor package is disclosed. According to an embodiment, the semiconductor package comprises a substrate formed of electrically insulating material and comprising a die mounting surface, a first semiconductor die embedded within the substrate and comprising a first conductive terminal that faces the die mounting surface, a second semiconductor die mounted on the die mounting surface and comprising a first conductive terminal that faces and is spaced apart from the die mounting surface, and a first electrical connection that directly connects the first conductive terminals of the first and second semiconductor dies together, wherein the second semiconductor die partially overlaps with the first semiconductor die.

Separately or in combination, the first and second semiconductor dies are arranged such that the first conductive terminals of the first and second semiconductor dies are aligned with one another, and the first electrical connection comprises one or more conductive structures that directly vertically extend between the first conductive terminals of the first and second semiconductor dies.

Separately or in combination, the second semiconductor die comprises a switching device, the first semiconductor die comprises a driver that is configured to control the switching device, and the first electrical connection is a connection between an output terminal of the driver and a control terminal of the switching device.

Separately or in combination, the switching device is a high electron mobility transistor.

Separately or in combination, the first semiconductor die further comprises a second conductive terminal that faces the die mounting surface, and the semiconductor package further comprises a third semiconductor die mounted on the die mounting surface and comprising a first conductive terminal that faces the die mounting surface, and a second electrical connection that directly connects the second conductive terminal of the first semiconductor to the first conductive terminal of the third semiconductor die, wherein the third semiconductor die partially overlaps with the first semiconductor die.

Separately or in combination, the second semiconductor die extends directly over a first edge side of the first semiconductor die, and the third semiconductor die extends directly over a second edge side of the first semiconductor die that is opposite from the first outer edge side.

Separately or in combination, the first and third semiconductor dies are arranged such that the second conductive terminal of the first semiconductor die is aligned with the first conductive terminal of the third semiconductor die, and the second electrical connection comprises one or more conductive structures that directly vertically extend between the second conductive terminal of the first semiconductor die and the first conductive terminal of the third semiconductor die.

Separately or in combination, the semiconductor package further comprises a fourth semiconductor die mounted on the die mounting surface, the fourth semiconductor die does not overlap with the first semiconductor die, and the fourth semiconductor die comprises a passive electrical component.

Separately or in combination, the first electrical connection comprises a first conductive via that is disposed within the substrate and contacts the first conductive terminal of the first semiconductor die, and a first conductive pillar or solder bump that is disposed outside of the substrate and contacts the first conductive terminal of the second semiconductor die.

Separately or in combination, the substrate further comprises a structured metallization layer that is disposed on the die mounting surface and comprises a plurality of islands that are physically isolated from one another, the first electrical connection further comprises a first one of the islands, and the first one of the islands is completely contained within an areal footprint of the second semiconductor die.

Separately or in combination, the substrate is a laminate substrate.

Separately or in combination, the semiconductor package further comprises an electrically insulating encapsulant body on top of the die mounting surface that encapsulates the second semiconductor die.

A laser diode driver package is disclosed. According to an embodiment, the laser diode driver package comprises a substrate, a driver die embedded within the substrate, and a GaN die having a gate pad attached to a patterned metallization layer of the laminated substrate, the GaN die configured to output a switched current for a laser diode, wherein an output pad of the driver die faces the gate pad of the GaN die and at least partially overlaps with the gate pad of the GaN die, wherein the output pad of the driver die is electrically connected to the gate pad of the GaN die through a first vertical connection that comprises part of the patterned metallization layer of the substrate, and wherein a length of the vertical connection is 150 μm or less.

Separately or in combination, the length of the vertical connection is in a range between 100 μm and 150 μm.

Separately or in combination, the vertical connection further comprises Cu pillars or solder bumps disposed on top of the substrate.

A method of producing a semiconductor package is disclosed. According to an embodiment, the method comprises providing a substrate formed of electrically insulating material and comprising: a die mounting surface, and a first semiconductor die embedded within the substrate, the first semiconductor die comprising a first conductive terminal that faces the die mounting surface, providing a second semiconductor die that comprises a first conductive terminal, and mounting the second semiconductor die on the die mounting surface such that the first conductive terminal of the second semiconductor die faces and is spaced apart from the die mounting surface, a first electrical connection that directly connects the first conductive terminals of the first and second semiconductor dies together is formed, and the second semiconductor die partially overlaps with the first semiconductor die.

Separately or in combination, mounting the second semiconductor die comprises arranging the second semiconductor die such that the first conductive terminals of the first and second semiconductor dies are aligned with one another, and the first electrical connection comprises one or more conductive structures that directly vertically extend between the first conductive terminals of the first and second semiconductor dies.

Separately or in combination, the substrate is provided to comprise a first bond pad at the die mounting surface and a first conductive via connected between the first bond pad and the first conductive terminal of the first semiconductor die, and mounting the second semiconductor die on the die mounting surface comprises arranging a first conductive pillar or solder bump between the first bond pad and the first conductive terminal of the second semiconductor die.

Separately or in combination, the second semiconductor die comprises a switching device, wherein the first semiconductor die comprises a driver that is configured to control the switching device, and wherein the first electrical connection is a connection between an output terminal of the driver and a control terminal of the switching device.

Separately or in combination, forming an electrically insulating encapsulant body on top of the die mounting surface that encapsulates the second semiconductor die.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes FIGS. 1A and 1B, illustrates a hybrid substrate assembly before encapsulation, according to an embodiment. FIG. 1A illustrates a side view of the hybrid substrate assembly and FIG. 1B illustrates a plan view of the hybrid substrate assembly.

FIGS. 3, 4 and 5 illustrate selected steps in a method for producing a hybrid substrate assembly, according to an embodiment.

DETAILED DESCRIPTION

Embodiments of a semiconductor package with multiple semiconductor dies and advantageously short connection paths between the semiconductor dies are described herein. The semiconductor package utilizes a hybrid substrate concept, meaning that it includes a substrate which serves dual roles. First, the substrate is configured as an encapsulant by containing a first semiconductor die embedded within it. Second, the substrate is configured as a carrier structure by accommodating a second semiconductor die mounted thereon. In this way, the first and second semiconductor dies can be disposed in an overlapping arrangement with a terminal from each die being aligned with one another. This in turn allows for a short and direct vertical electrical connection between the terminals of the two dies. As a result, the impact of parasitic effects (e.g., inductance, capacitance, etc.) of the connection between the first and second semiconductor dies is substantially reduced.

Figure 1:
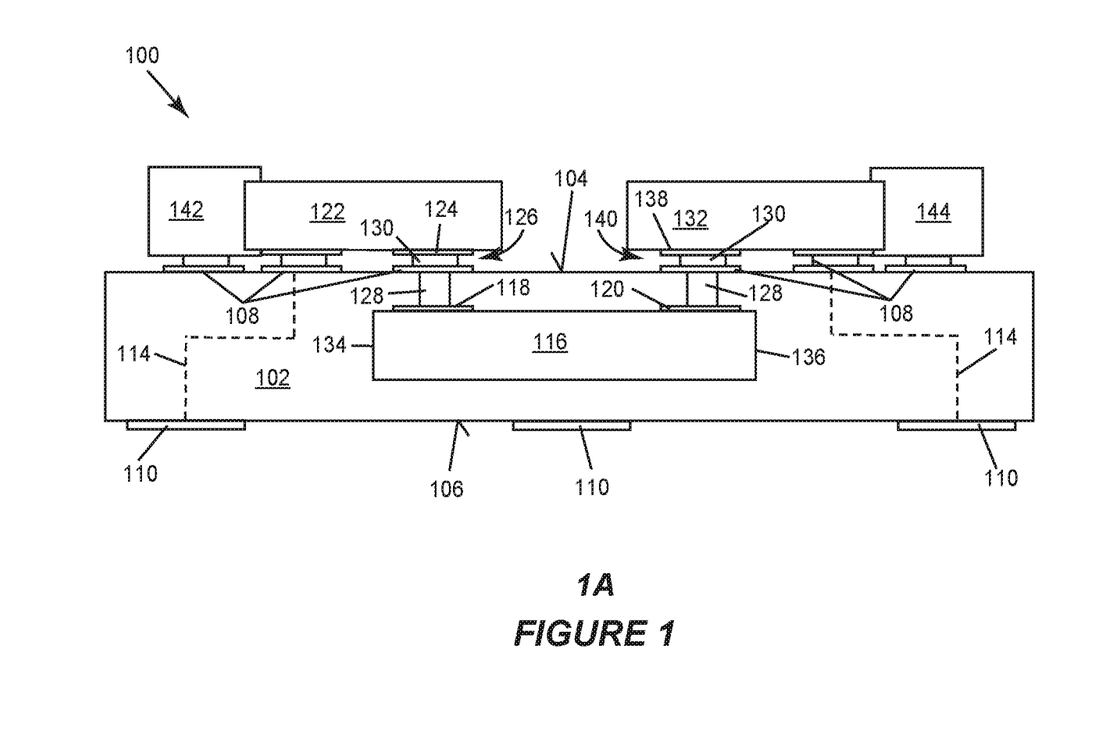
Figure 1B:
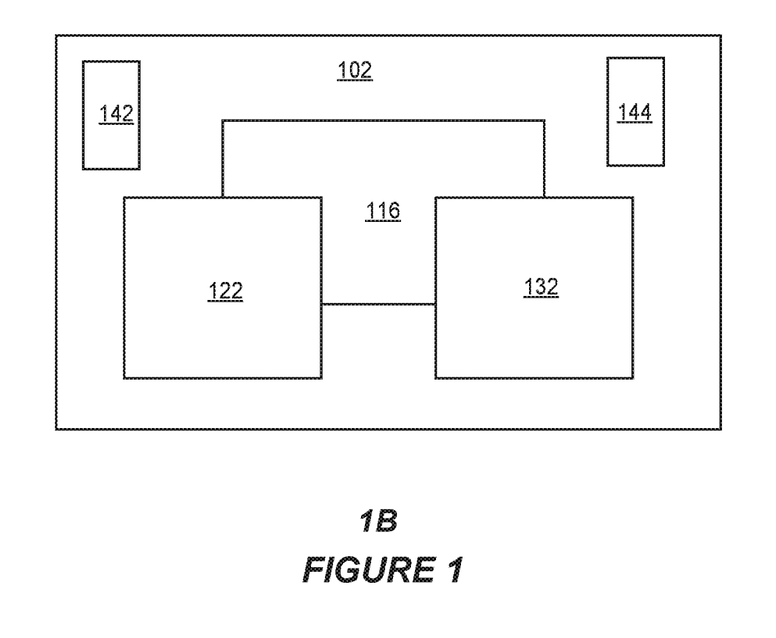

Referring to FIG. 1, a semiconductor package 100 comprises a substrate 102. The substrate 102 comprises a die mounting surface 104 and a lower surface 106 opposite the die mounting surface 104. A plurality of bond pads 108 are disposed on the die mounting surface 104. The bond pads 108 are electrically conductive structures that are configured to interface with a terminal from a semiconductor die, e.g., using a conductive intermediary such as a solder. A plurality of external terminals 110 are disposed on the lower surface 106 of the substrate 102. The external terminals 110 are externally accessible points of electrical contact that are configured to interface with a global circuit carrier, such as a PCB or power module substrate. As shown, the external terminals 110 are configured to provide a so-called leadless package configuration. Alternatively, the external terminals 110 may be configured according to a variety of different package styles, e.g., through-hole, surface mount, etc., and/or may protrude out of side surfaces of the substrate instead of the lower surface 106. The external terminals 110 can be electrically connected to the bond pads 108 through substrate interconnections 114, two of which are schematically represented in the FIG. 1A. These substrate interconnections 114 can comprise different electrical interconnect structures such as conductive through-vias formed within the substrate 102, conductive tracks formed within or on the substrate 102, bond wires, clips, ribbons, etc.

According to an embodiment, the substrate 102 is a laminate substrate that comprises multiple constituent insulating layers successively formed on top of one another. In that case, the bond pads 108 and the external terminals 110 can be provided as plated metal layers, e.g., electroplating or electroless, that are patterned by etching techniques.

In another embodiment, the substrate 102 is a molded package body. For instance, the substrate 102 can have the configuration of a semiconductor package such as a molded interconnect substrate (MIS) package or quad flat no leads QFN (quad flat no leads) package, wherein the insulative material of the substrate 102 corresponds to a mold material such as an epoxy or thermosetting plastic.

In yet another embodiment, the substrate 102 is a printed circuit board (PCB). In that case, the insulative material of the substrate 102 can comprise a pre-impregnated composite fiber such as FR-4. In that case, the bond pads 108 can be provided from a patterned metallization layer bonded to an uppermost constituent insulating layer of the substrate 102, and the external terminals 110 can likewise be provided by a patterned metallization layer bonded to a lowermost constituent insulating layer of the substrate 102.

More generally, the substrate 102 can be any structure that comprises an electrically insulating body and electrically conductive interconnect features such as conductive tracks, bond pads, or vias, that are configured to route electrical signals. The electrically insulating body can include any electrical insulator with sufficient mechanical strength to support semiconductor devices formed thereon, e.g., ceramics, epoxy materials, plastics, resin materials, pre-impregnated composite fiber, etc. The conductive features of the substrate 102 can comprise or plated with or be plated with a variety of conductive metals such as Cu, Al, Ni, Ag, Au, Pd, Pt, Ni, etc.

A first semiconductor die 116 is embedded within the substrate 102. This means that the first semiconductor die 116 is contained within the substrate 102 such that all outer surfaces of the first semiconductor die 116 are separated from an exterior of the substrate 102. The first semiconductor die 116 comprises first and second conductive terminals 118, 120 disposed on a main surface of the first semiconductor die 116. The first and second conductive terminals 118, 120 of the first semiconductor die 116 face the die mounting surface 104 and are spaced apart from the die mounting surface 104. The first and second conductive terminals 118, 120 first semiconductor die 116 can be spaced very closely to the die mounting surface 104, e.g., within 25 µm-75 µm. In an embodiment wherein the substrate 102 is configured as a laminate substrate, a single one of the constituent layers of the laminate substrate can be provided on top of the main surface of the first semiconductor die 116 to obtain this close separation distance.

The semiconductor package 100 further comprises a second semiconductor die 122 mounted on the die mounting surface 104. The second semiconductor die 122 comprises a first conductive terminal 124 disposed on a main surface of the second semiconductor die 122. The second semiconductor die 122 is mounted such that the first conductive terminal 124 of the second semiconductor die 122 faces and is spaced apart from the die mounting surface 104.

The second semiconductor die 122 overlaps with the first semiconductor die 116. This means that at least a portion of the second semiconductor die 122 is directly over the first semiconductor die 116. In the depicted embodiment, the second semiconductor die 122 partially overlaps with the first semiconductor die 116, meaning that a portion of the second semiconductor die 122 is directly over the first semiconductor die 116 and another portion of the second semiconductor die 122 is not directly over the first semiconductor die 116.

The first and second semiconductor dies 116, 122 are arranged such that the first conductive terminal 118 of the first semiconductor die 116 is aligned with the first conductive terminal 124 of the second semiconductor die 122. This means that the first conductive terminal 124 of the second semiconductor die 122 at least partially overlaps with the first conductive terminal 118 of the first semiconductor die 116. In the depicted embodiment, there is complete overlap between these two terminals. In other embodiments, the first conductive terminal 124 of the second semiconductor die 122 partially overlaps with first conductive terminal 118 of the first semiconductor die 116, meaning that a portion of the first conductive terminal 124 of the second semiconductor die 122 is not directly over the first conductive terminal 118 of the first semiconductor die 116. Separately or in combination, the first conductive terminal 124 of the second semiconductor die 122 can be larger or smaller than the first conductive terminal 118 of the first semiconductor die 116 such that one of these terminals laterally overhangs past the other. The description of "aligned with one another" applies to each one of the aforementioned possibilities.

The semiconductor package 100 comprises a first electrical connection 126 that directly connects the first conductive terminal 118 of the first semiconductor die 116 to the first conductive terminal 124 of the second semiconductor die 122. The first electrical connection 126 can comprise multiple conductive structures that are in low ohmic contact with one another and provide a low-resistance path between the first conductive terminal 118 of the first semiconductor die 116 and the first conductive terminal 124 of the second semiconductor die 122.

In the depicted embodiment, the first electrical connection 126 comprises a first via 128, a first one of the bond pads 108, and a first solder bump 130. The first via 128 is disposed within the substrate 102 and contacts the first conductive terminal 118 of the first semiconductor die 116. The first solder bump 130 is formed on the first one of the bond pads 108 and contacts the first conductive terminal 124 of the second semiconductor die 122. The first solder bump 130 can be reflowed solder that fuses together with the first one of the bond pads 108 and the first conductive terminal 124 of the second semiconductor die 122. In another embodiment, the first electrical connection 126 comprises a conductive pillar structure instead of the first solder bump 130. In either case, the height of the first solder bump 130 or conductive pillar structure can be selected to meet minimum standoff requirements. For example, the height of the first solder bump or conductive pillar can be selected to be between about 25 µm and 75 µm after solder reflow, i.e., a stable mounted configuration.

More generally, the first electrical connection 126 can comprise any combination of one or more conductive structures that form part of a direct conduction path between the first conductive terminal 118 of the first semiconductor die 116 and the first conductive terminal 124 of the second semiconductor die 122.

In the depicted embodiment, the first electrical connection 126 directly vertically extends between the first conductive terminal 118 of the first semiconductor die 116 and the first conductive terminal 124 of the second semiconductor die 122. This means that the area of overlap between the first conductive terminal 118 of the first semiconductor die 116 and the first conductive terminal 124 of the second semiconductor die 122 is occupied by the one or more conductive structures which form the first electrical connection 126. As a result, the first electrical connection 126 forms a vertical current path that extends perpendicularly to the main surfaces of the first and second semiconductor dies 116, 122.

The above described arrangement advantageously allows for a very short and direct conductive connection between the terminals of the first and second semiconductor dies 116, 122. In particular, by aligning the terminals of the first and second semiconductor dies 116, 122 with one another, the first electrical connection 126 can be effectuated without using lateral electrical connectors such as clips, bond wires, conductive tracks, etc. The minimum obtainable length of the first electrical connection 126 is thus only limited by the minimum vertical height of the elements which form the first electrical connection 126, e.g., the first via 128, the first one of the bond pads 108, and the first solder bump 130. In an embodiment, a total length of the first electrical connection 126 as measured between the first conductive terminal 118 of the first semiconductor die 116 and the first conductive terminal 124 of the second semiconductor die 122 is less than 250 µm. More specifically, this total length may be between 100 µm and 150 µm.

The semiconductor package 100 further comprises a third semiconductor die 132 that is mounted on the die mounting surface 104. The third semiconductor die 132 may be arranged to partially overlap with the first semiconductor die 116 in a similar manner as previously described with reference to the first and second semiconductor dies 116, 122. In the depicted embodiment, the second semiconductor die 122 extends directly over a first edge side 134 of the first semiconductor die 116 and the third semiconductor die 132 extends directly over a second edge side 136 of the first semiconductor die 116 that is opposite from the first outer edge side 134. More generally, any arrangement with partial overlap is possible.

The third semiconductor die 132 comprises a first conductive terminal 138 disposed on a main surface of the third semiconductor die 132. The third semiconductor die 132 is mounted such that the first conductive terminal 138 of the third semiconductor die 132 faces and is spaced apart from the die mounting surface 104. The first conductive terminal 138 of the third semiconductor die 132 is aligned with the second conductive terminal 120 of the first semiconductor die 116 in the same way as the first conductive terminal 118 of the first semiconductor die 116 and the first conductive terminal 124 of the second semiconductor die 122.

The semiconductor package 100 further comprises a second electrical connection 140 that directly connects the second conductive terminal 120 of the first semiconductor die 116 with the first conductive terminal 138 of the third semiconductor die 132. The second electrical connection 140 may have the same geometric configuration and may be formed from the same conductive structures as the first electrical connection 126, according to any of the previously described embodiments.

Generally speaking, the first, second and third semiconductor dies 116, 122 and 132 can have a wide variety of device configurations. As between any two of the first, second and third semiconductor dies 116, 122 and 132, these device configurations can be the same or different from one another. Examples of these device configurations include discrete devices such as transistors or diodes, and integrated devices such as logic devices, controllers, sensors, etc. These devices may be made from type IV semiconductor technology, e.g., silicon, silicon germanium, silicon carbide, etc., and type III-V semiconductor technology, e.g., gallium nitride, gallium arsenide, etc. These devices can be configured as a lateral device (as shown) wherein each terminal of the die is disposed on a single main surface and the device is configured to conduct in a lateral direction that is parallel to this main surface. Alternatively, these devices can be configured as a vertical device wherein the conduction path vertically extends between a first load terminal that is disposed on a main surface and a second load terminal that is disposed on a rear surface opposite the main surface.

According to an embodiment, the second and third semiconductor dies 122, 132 are configured as switching devices. Examples of these switching devices include MOSFETs (metal-oxide semiconductor field-effect transistors), IGBTs (insulated gate bipolar transistors), HEMTs (high electron mobility transistors). Meanwhile, the first semiconductor die 116 can be configured as a driver device that is configured to generate a control signal for switching the second and third semiconductor dies 122, 132. In that case, the first and second electrical connections 126, 140 can provide a connection path between output terminals of the driver and the control terminals (e.g., gate) of the second and third semiconductor dies 122, 132, respectively.

According to an embodiment, the semiconductor package 100 is configured as a laser diode driver package. A laser diode is a diode that emits laser energy when operating in forward conduction mode in similar manner as a light-emitting diode (LED), except that the emitted energy forms a laser beam, i.e., a highly concentrated beam of electromagnetic energy. The emitted energy can fall anywhere on the energy spectrum between the infrared range and the UV (ultraviolet) range). A laser diode driver package comprises one or more switching devices that generate a current sufficient to illuminate a laser diode. The current can be a switched current, meaning that the output current oscillates between a high value and a low value. A laser diode driver package must generate the switched current to have sufficient magnitude to illuminate a laser diode and frequency to meet the laser repetition rate of the application.

One specific example of a laser diode application is a so-called LiDAR application. The basic working principle of LiDAR is to measure the distance to an adjacent object by illuminating the object with laser light, sensing a reflection, and measuring the reflection time. Automotive applications utilize LiDAR based sensors to measure the distance between the automobile and other objects in the vicinity. These LiDAR based sensors require a driver package to generate a switched current of at least 30 A, 40 A, 50 A, etc. in pulses of no greater than 10 ns, 5 ns, no greater than 2 ns, etc. More generally, laser diode applications may require a driver package to generate a switched current of at of 10A or more in pulses of no more than 100 ns.

In an embodiment wherein the semiconductor package 100 is a laser diode driver package, the second and third semiconductor dies 122, 132 are configured as switching devices, and the first semiconductor die 116 is configured as a driver device in the same manner described above. To meet the aforementioned current driving capability and switching frequency requirements for a laser diode driver package, the second and third semiconductor dies 122, 132 can comprise a III-Nitride semiconductor material, such as gallium arsenide (GaAs), gallium phosphide (GaP), indium phosphide (InP), gallium nitride (GaN), etc. In this case, the second and third semiconductor dies 122, 132 can each include one or more HEMT devices formed by the III-Nitride semiconductor material. Due to the highly conductive channel, these types of HEMT devices can be switched at very high frequencies while simultaneously providing current pulses of high magnitude.

In one specific embodiment of a laser diode driver package, the second and third semiconductor dies 122, 132 are GaN based HEMT devices. These GaN dies comprise output terminals (e.g., source and drain terminal) (not shown in FIG. 1) that are connected to the external terminals 110 of the substrate 102. The GaN dies generate the switched current for driving the laser diode at one of these output terminals. The gate pads of these GaN dies correspond to the first conductive terminals 124, 128 of the first and second semiconductor dies 116, 122. The output pad of the driver die corresponds to the first conductive terminal of the first semiconductor die 116. In this arrangement, the first and second electrical connections 126, 140 carry the control signals used to switch the GaN dies.

Due to the short and direct conduction paths provided by the first and second electrical connections 126, 140, the semiconductor package 100 can be configured as a laser diode driver package with advantageous performance characteristics. Specifically, the low parasitic influence of the first and second electrical connections 126, 140 (e.g., capacitance and inductance) means that the control signal applied to the switching devices can be rapidly transitioned, which in turn enables rapid switching of the switching devices themselves.

According to an embodiment, the semiconductor package 100 further comprises additional electrical components that are mounted on the die mounting surface 104 but do not overlap with the first semiconductor die 116. For example, as shown, the semiconductor package 100 comprises fourth and fifth semiconductor dies 142, 144 mounted on the die mounting surface 104 outside of the lateral boundary of the first semiconductor die 116. In an embodiment, the fourth and fifth semiconductor dies 142, 144 are discrete capacitor devices that are configured to provide output signal enhancement such as impedance matching, harmonic filtering, etc. More generally, the additional electrical components may comprise different mountable electronic components including passive components such as capacitors, inductors, resistors, etc., active components such as transistors, thyristors, etc., and integrated components such as logic devices, sensors, etc.

The remaining terminals of the second semiconductor dies 122, 132 (e.g., source and drain terminals in the case of a transistor) and the terminals of any additional devices (if present) can be electrically connected to the bond pads 108 of the substrate 130 by solder bumps 130 or pillars, for example. The bond pads 108 associated with each additional electrical connection may be electrically connected to one of the external terminals 110 of the substrate 102 so that the terminals of each mounted element are electrically accessible.

Figure 2:
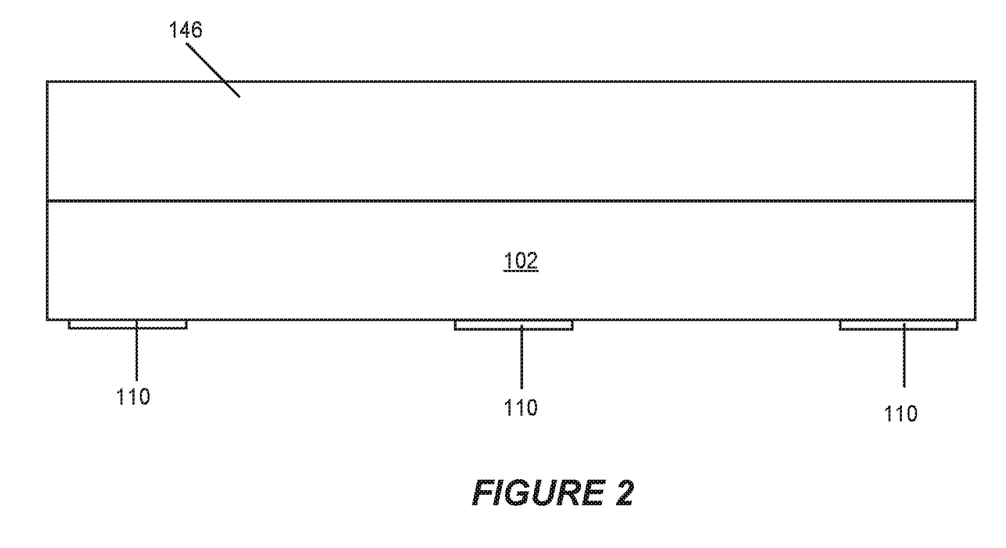
FIG. 2 illustrates a hybrid substrate assembly after encapsulation, according to an embodiment.

Referring to FIG. 2, an encapsulant body 146 is formed on the substrate 102. The encapsulant body 146 seals and electrically insulates each of the elements mounted on the die mounting surface 104, i.e., the second, third, fourth and fifth semiconductor dies 122, 132, 142, 144 in the depicted embodiment. The encapsulant body 146 can comprise any electrically insulating material that seals electrical elements e.g., epoxy materials, thermosetting plastic, etc.

Figure 3:
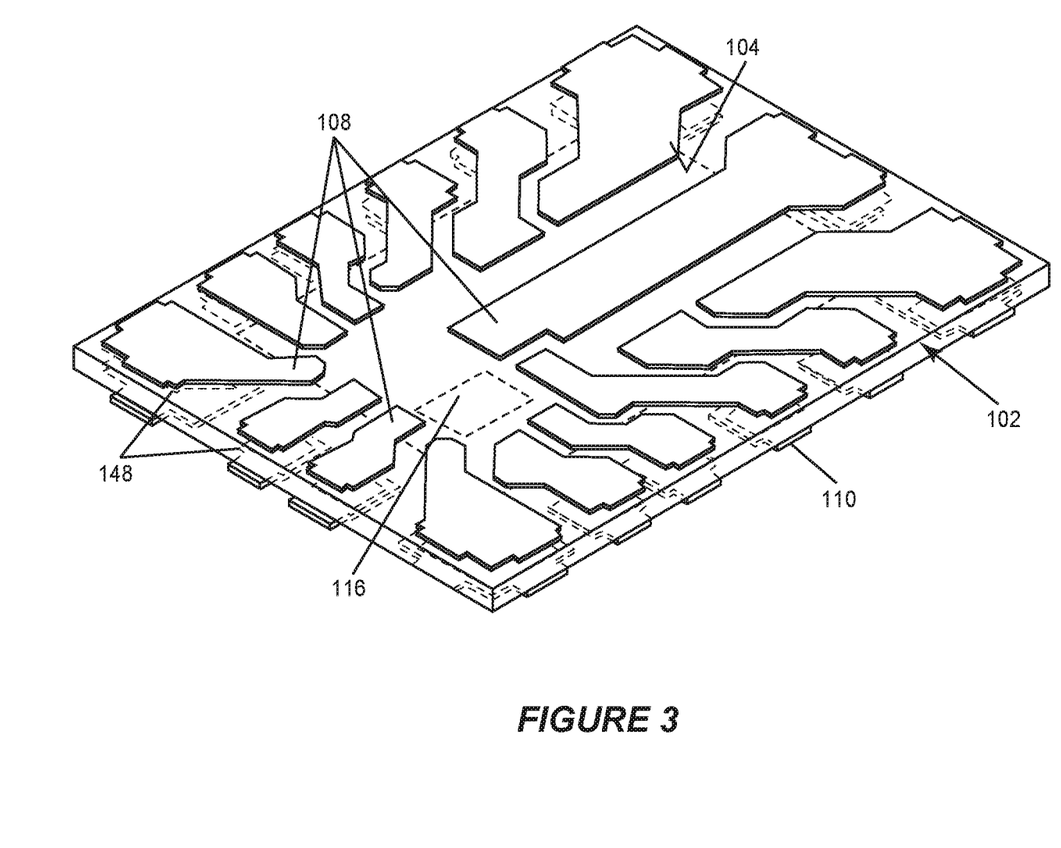
FIG. 3 illustrates providing a hybrid substrate with a first semiconductor die embedded within the substrate.
Figure 4:
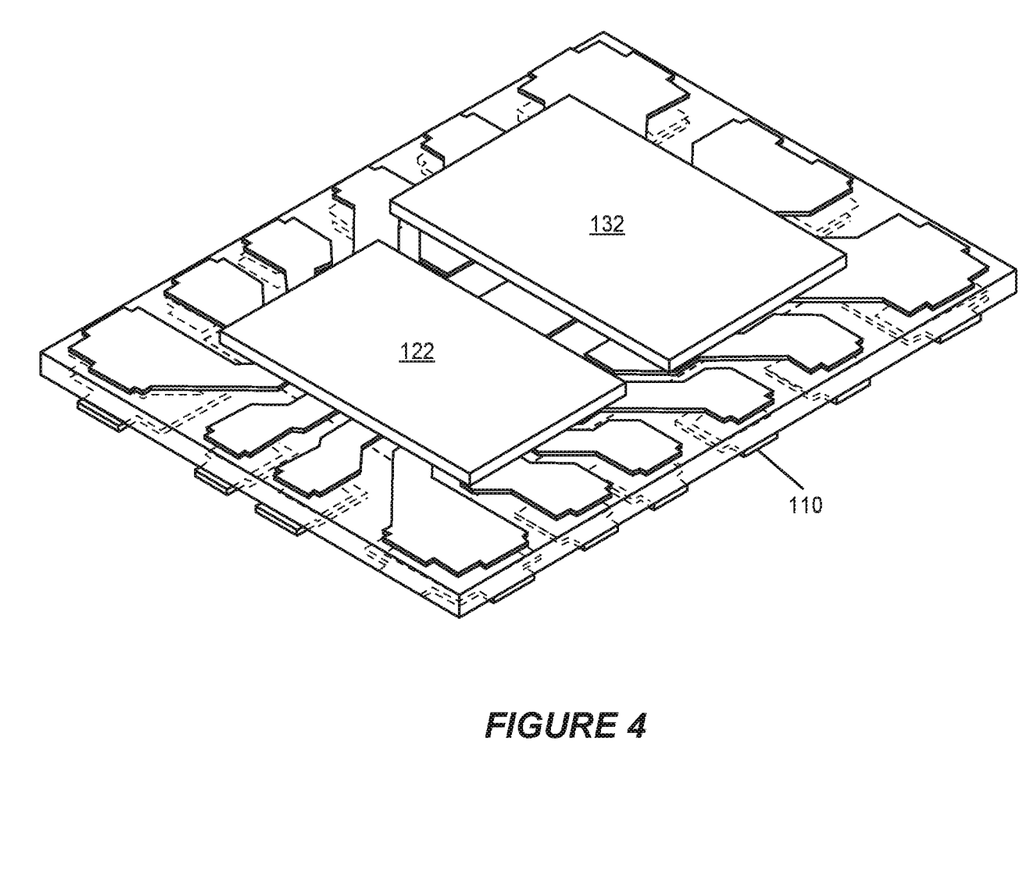
FIG. 4 illustrates mounting second and third semiconductor dies on the substrate.
Figure 5:
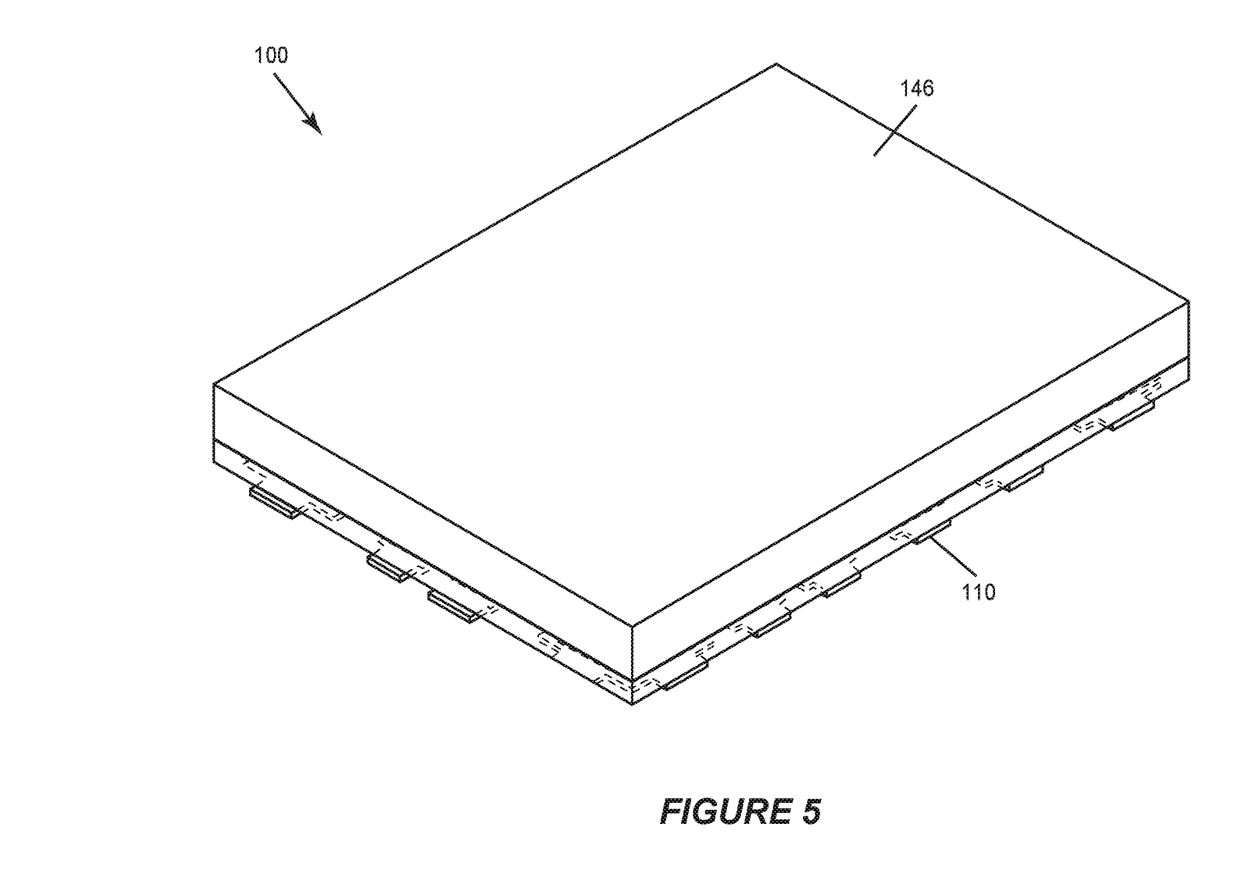
FIG. 5 illustrates forming an encapsulant body on the substrate.

Referring to FIGS. 3-5, one example of a method for producing the semiconductor package 100 is depicted. As shown in FIG. 3, the substrate 102 is initially provided to include the first semiconductor die 116 embedded within it. The substrate 102 comprising the first semiconductor die 116 can be produced by one manufacturer and delivered as a standalone component to another manufacturer. Moreover, this substrate 102 can be produced in strip form so that multiple packaged devices can be produced in parallel.

In the embodiment of FIG. 3, the substrate 102 is configured as a laminate substrate. This laminate substrate can include several (e.g., two, three, four, etc.) constituent layers of laminate material, such as FR-4 or bismaleimide-triazine (BT). These constituent layers can have a thickness in the range of 50 μm to 150 μm, for example. The bond pads 108 and/or the external terminals 110 may be provided from a patterned metallization layer, such as a patterned Cu foil with a thickness in the range of 50 μm to 100 μm, for example. The patterned metallization layer is structured into a plurality of islands that are physically isolated from one another, meaning that these islands are not joined together by any portion of the first patterned metallization layer. The laminate substrate can include via structures formed from a conductive metal, such as Cu, W, etc. A diameter of these vias structures can be in the range of 50 μm to 125 μm, for example. These via structures form the vias 128 that connect the upper surface terminals of the first semiconductor die 116 with the bond pads 108. Additionally, these via structures can form vertical through-via structures 148 that electrically connect the bond pads 108 with the external terminals 110.

Referring to FIG. 4, after providing the substrate 102, the second and third semiconductor dies 122, 132 are mounted on the substrate 102. This can be done using a flip-chip technique wherein Cu solder bump or pillars are provided on the bond pads 108 and the second and third semiconductor dies 122, 132 are attached and electrically connected by solder reflow. Any additional elements (now shown) such as additional capacitors can be attached by a similar technique, or any other soldering technique such as a printed solder technique.

In the depicted embodiment, the patterned metallization layer which forms the bond pads 108 is structured such that each of the isolated islands fans out from a central location to reach one of the vertical through-via structures 148, thus forming an electrical connection to the external terminals 110. Alternatively, some of these fan-out connections can be omitted. For example, in the above described embodiments wherein the first semiconductor die 116 is a driver die and the second and third semiconductor dies 122, 132 are configured as switching devices, the nodes associated with the first and second electrical connections 126, 140 may not require external electrical contact. Accordingly, in another embodiment, the patterned metallization layer is structured such that one or more of the islands which forms the bond pads 108 is completely contained within an areal footprint of the second semiconductor die 122 or the third semiconductor die 132, as the case may be. These completely contained islands may correspond to the bond pads 108 which form part of the first and second electrical connections 126, 140 as described herein.

Referring to FIG. 5, after mounting the first and second semiconductor dies 116, 122, an encapsulation process is performed to form an encapsulant body 146 that encapsulates each one of the components mounted on the substrate 102. The encapsulant body 146 can be formed by a molding process such injection molding, transfer molding, compression molding, etc.

The term "laminate substrate" refers to a rigid insulative substrate that comprises multiple layers of electrically insulating material successively stacked on top of one another. Each constituent layer can generally comprise any dielectric material that is suitable for semiconductor encapsulation. Examples of these dielectric materials include epoxy materials, blended epoxy and glass fiber materials such as FR-4, FR-5, CEM-4, etc., and resin materials such as bismaleimide trazine (BT) resin. A laminate substrate is produced by sequential deposition of the constituent insulating layers on top of one another. Due to this process, conductive interconnect layers can be formed on the surface of each of the constituent insulating layers. This substrate construction differs from a molded substrate wherein a monolithic region of electrically insulating compound is formed to surround an encapsulated element using a molding technique such as injection molding.

The term "direct connection" as used herein in reference to an electrical connection describes a low resistance electrical connection provided by one or more electrically conductive structures which contact the connected elements and provide a conductive path between the connected elements that is exclusively through conductive material.

A high electron mobility transistor refers to a type of transistor device wherein the channel is provided by a two-dimensional charge carrier gas (i.e., a two-dimensional electron gas (2DEG) or a two-dimensional hole gas (2DHG)) that intrinsically arises near a heterojunction between two semiconductor regions with different band gaps. The heterojunction forming layers of the high electron mobility transistor (i.e., the barrier layer and the channel layer) can include any binary, ternary or quaternary III-V semiconductor materials responsible for this device concept. Examples of these III-V semiconductor materials include gallium arsenide (GaAs), gallium phosphide (GaP), indium phosphide (InP), gallium nitride (GaN), aluminium gallium nitride (AlGaN), indium gallium phosphide (InGaPa) or indium gallium arsenide phosphide (InGaAsP). This device concept produces a channel with extremely high carrier mobility. Due to this property, high electron mobility transistors offer high frequency operation and high transconductance in comparison to other technologies, such as silicon-based MOSFET technology.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of producing a semiconductor package, the method comprising:
    providing a substrate formed of electrically insulating material and comprising: a die mounting surface, and a first semiconductor die embedded within the substrate, the first semiconductor die comprising a first conductive terminal that faces the die mounting surface;
    providing a second semiconductor die that comprises a first conductive terminal; and
    mounting the second semiconductor die on the die mounting surface such that:
    the first conductive terminal of the second semiconductor die faces and is spaced apart from the die mounting surface;
    a first electrical connection that directly connects the first conductive terminals of the first and second semiconductor dies together is formed; and
    the second semiconductor die partially overlaps with the first semiconductor die,
    wherein the second semiconductor die comprises a switching device, wherein the first semiconductor die comprises a driver that is configured to control the switching device, and wherein the first electrical connection is a connection between an output terminal of the driver and a control terminal of the switching device, and
    wherein the method further comprises mounting a fourth semiconductor die on the die mounting surface, wherein the fourth semiconductor die does not overlap with the first semiconductor die, and wherein the fourth semiconductor die comprises a passive electrical component.

2. The method of claim 1, wherein mounting the second semiconductor die comprises arranging the second semiconductor die such that the first conductive terminals of the first and second semiconductor dies are aligned with one another, and wherein the first electrical connection comprises one or more conductive structures that directly vertically extend between the first conductive terminals of the first and second semiconductor dies.

3. The method of claim 2, wherein the substrate is provided to comprise a first bond pad at the die mounting surface and a first conductive via connected between the first bond pad and the first conductive terminal of the first semiconductor die, and wherein mounting the second semiconductor die on the die mounting surface comprises arranging a first conductive pillar or solder bump between the first bond pad and the first conductive terminal of the second semiconductor die.

4. The method of claim 3, wherein the substrate further comprises a structured metallization layer that is disposed on the die mounting surface and comprises a plurality of islands that are physically isolated from one another, wherein the first electrical connection further comprises a first one of the islands, and wherein the first one of the islands is completely contained within an areal footprint of the second semiconductor die.

5. The method of claim 4, wherein the substrate is a laminate substrate.

6. The method of claim 5, further comprising forming an electrically insulating encapsulant body on top of the die mounting surface that encapsulates the second semiconductor die.

7. The method of claim 1, further comprising: forming an electrically insulating encapsulant body on top of the die mounting surface that encapsulates the second semiconductor die.

8. A method of producing a semiconductor package, the method comprising:
    providing a substrate formed of electrically insulating material and comprising: a die mounting surface, and a first semiconductor die embedded within the substrate, the first semiconductor die comprising a first conductive terminal that faces the die mounting surface;
    providing a second semiconductor die that comprises a first conductive terminal; and
    mounting the second semiconductor die on the die mounting surface such that:
    the first conductive terminal of the second semiconductor die faces and is spaced apart from the die mounting surface;
    a first electrical connection that directly connects the first conductive terminals of the first and second semiconductor dies together is formed; and
    the second semiconductor die partially overlaps with the first semiconductor die,
    wherein the second semiconductor die comprises a switching device, wherein the first semiconductor die comprises a driver that is configured to control the switching device, and wherein the first electrical connection is a connection between an output terminal of the driver and a control terminal of the switching device.

* * * * *